United States Patent
Koh et al.

(10) Patent No.: US 9,905,790 B2
(45) Date of Patent: Feb. 27, 2018

(54) OPTOELECTRONIC DEVICE INCLUDING QUANTUM DOT

(71) Applicant: SAMSUNG ELECTRONICS CO., LTD., Suwon-si (KR)

(72) Inventors: Weonkyu Koh, Suwon-si (KR); Taeho Shin, Cheonan-si (KR); Kyungsang Cho, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/091,650

(22) Filed: Apr. 6, 2016

(65) Prior Publication Data
US 2017/0117496 A1   Apr. 27, 2017

(30) Foreign Application Priority Data

Oct. 27, 2015  (KR) .................. 10-2015-0149720

(51) Int. Cl.
*H01L 51/50* (2006.01)
*H01L 51/42* (2006.01)

(52) U.S. Cl.
CPC ........ *H01L 51/502* (2013.01); *H01L 51/4273* (2013.01); *H01L 51/5072* (2013.01);
(Continued)

(58) Field of Classification Search
CPC .............. H01L 51/502; H01L 51/5088; H01L 51/5096; H01L 51/4273; H01L 51/6072
See application file for complete search history.

(56) References Cited

U.S. PATENT DOCUMENTS

2006/0043361 A1   3/2006  Lee et al.
2007/0215856 A1   9/2007  Kwon et al.
(Continued)

FOREIGN PATENT DOCUMENTS

KR   1020120029096 A   3/2012
KR   1020120038472 A   4/2012
(Continued)

OTHER PUBLICATIONS

Moon Kee Choi et al., "Wearable red—green—blue quantum dot light-emitting diode array using high-resolution intaglio transfer printing", Nature Communication, 6:7149, DOI: 10.1038/ncomms8149, May 14, 2015, Total 8 pages, URL: www.nature.com/naturecommunications.
(Continued)

*Primary Examiner* — Matthew Reames
(74) *Attorney, Agent, or Firm* — Sughrue Mion, PLLC

(57) ABSTRACT

Provided are optoelectronic devices including quantum dots. An optoelectronic device may include an active layer including a quantum dot and at least one molecular interlayer adjacent to the active layer. The active layer may be provided between two electrodes, and a charge transfer layer may be provided adjacent to the active layer. The molecular interlayer may be provided between the active layer and the charge transfer layer. The molecular interlayer may have a smaller amount of surface charge than the charge transfer layer. The molecular interlayer may include a nonionic material or a hydrophobic material. The charge transfer layer may include an electron transport layer, and the electron transport layer may include an inorganic semiconductor.

26 Claims, 15 Drawing Sheets

| Cathode | — 200 |
| ETL | — 170 |
| Molecular interlayer | — 160 |
| Active (QD) | — 150 |
| HTL | — 120 |
| HIL | — 110 |
| Anode | — 100 |

(52) U.S. Cl.
CPC ...... *H01L 51/5088* (2013.01); *H01L 51/5096* (2013.01); *H01L 51/426* (2013.01); *H01L 2251/305* (2013.01)

(56) References Cited

U.S. PATENT DOCUMENTS

| | | |
|---|---|---|
| 2009/0039764 A1 | 2/2009 | Cho et al. |
| 2010/0237323 A1 | 9/2010 | Akai et al. |
| 2012/0138894 A1 | 6/2012 | Qian et al. |
| 2013/0015424 A1 | 1/2013 | Chung et al. |
| 2014/0231759 A1 | 8/2014 | Kim et al. |

FOREIGN PATENT DOCUMENTS

| | | |
|---|---|---|
| KR | 1020120047481 A | 5/2012 |
| KR | 1020120106476 A | 9/2012 |
| WO | 2009/103124 A1 | 8/2009 |

OTHER PUBLICATIONS

Wonjung Kim et al., "Binary Amine-Phosphine Passivation of Surface Traps on CdSe Nanocrystals", J. Phys. Chem. C, vol. 114, No. 3, 2010, American Chemical Society, Published on Jan. 5, 2010, pp. 1539-1546.

Kyung-Sang Cho et al., "High-performance crosslinked colloidal quantum-dot light-emitting diodes", Nature Photonics, vol. 3, Jun. 2009, Published online May 24, 2009, pp. 341-345, URL: www.nature.com/naturephotonics.

Benjamin S. Mashford et al., "High-efficiency quantum-dot light-emitting devices with enhanced charge injection", Nature Photonics, vol. 7, May 2013, Published online Apr. 21, 2013, pp. 407-412, URL: www.nature.com/naturephotonics.

Communication dated Mar. 1, 2017, from the European Patent Office in counterpart European Application No. 16167661.4.

FIG. 1

| Cathode | — 200 |
| --- | --- |
| ETL | — 170 |
| Molecular interlayer | — 160 |
| Active (QD) | — 150 |
| HTL | — 120 |
| HIL | — 110 |
| Anode | — 100 |

FIG. 11

| | |
|---|---|
| Cathode | 200 |
| ETL | 170 |
| Molecular interlayer | 160 |
| Active (QD) | 150 |
| Molecular interlayer | 130 |
| HTL | 120 |
| HIL | 110 |
| Anode | 100 |

FIG. 12

| Cathode | — 200 |
| EIL | — 180 |
| ETL | — 170 |
| Molecular interlayer | — 160 |
| Active (QD) | — 150 |
| HTL | — 120 |
| HIL | — 110 |
| Anode | — 100 |

FIG. 13

| Cathode | — 200 |
| --- | --- |
| ETL | — 170 |
| Molecular interlayer | — 160 |
| Active (QD) | — 150 |
| HTL | — 120 |
| Anode | — 100 |

FIG. 14

| Cathode | — 200 |
| ETL | — 170 |
| Molecular interlayer | — 160 |
| Active (QD) | — 150 |
| Anode | — 100 |

OPTOELECTRONIC DEVICE INCLUDING QUANTUM DOT

CROSS-REFERENCE TO RELATED APPLICATIONS

This application claims priority to Korean Patent Application No. 10-2015-0149720, filed on Oct. 27, 2015, in the Korean Intellectual Property Office, the disclosure of which is incorporated herein in its entirety by reference.

BACKGROUND

1. Field

Apparatuses and methods consistent with the present disclosure relate to optical devices, and more particularly, to optoelectronic devices including quantum dots.

2. Description of the Related Art

Optoelectronic devices utilize optoelectrical properties of a semiconductor, and include both devices that convert electric energy into optical energy, and devices that convert optical energy into electrical energy. Devices that convert electrical energy into optical energy include a light-emitting device such as a light-emitting diode (LED), a laser diode (LD), or the like. Devices that convert optical energy into electrical energy include a solar cell, a photodiode, or the like.

Properties and performances of the optoelectronic devices may vary depending on a semiconductor material applied thereto. Research into optoelectronic devices including quantum dots has been recently conducted. In particular, quantum dot light-emitting devices based on an electroluminescence phenomenon of the quantum dots are receiving greater attention. Along with organic light-emitting diodes (OLEDs), the quantum dot light-emitting devices may be used as highly efficient and low power consumption light-emitting devices of flexible/wearable devices. Also, the quantum dot light-emitting devices are being regarded as next-generation light-emitting devices due to their narrow light emission spectrum and wavelength adjustment convenience. However, when manufacturing an optoelectronic device including a quantum dot layer, undesired energy shift (loss) may occur between material layers, and it may not be easy to secure durability and stability of the device.

SUMMARY

Provided are optoelectronic devices (optoelectronic devices including quantum dots) having excellent performance.

Provided are optoelectronic devices with increased energy conversion efficiency.

Provided are optoelectronic devices with improved durability and stability.

Provided are optoelectronic devices in which interface properties between material layers are controlled.

Additional aspects will be set forth in part in the description which follows and, in part, will be apparent from the description, or may be learned by practice of the presented exemplary embodiments.

According to an aspect of an exemplary embodiment, an optoelectronic device includes a first electrode; a second electrode spaced apart from the first electrode; an active layer between the first and second electrodes, the active layer including a quantum dot; an electron transport layer between the active layer and the second electrode, the electron transport layer having a first surface charge; and a molecular interlayer between the electron transport layer and the active layer, the molecular interlayer including organic molecules and having a second surface charge less than the first surface charge.

The molecular interlayer may include a hydrophobic material

The molecular interlayer may include a nonionic material.

The molecular interlayer may include a low molecular material or a high molecular material.

The molecular interlayer may include tetracyanoquinodimethane (TCNQ).

A conduction band minimum energy level ($E_C$) of the molecular interlayer may be greater than or equal to an $E_C$ of the active layer and smaller than or equal to an $E_C$ of the electron transport layer.

The electron transport layer may include an inorganic semiconductor.

The inorganic semiconductor may include an oxide material or a non-oxide material, and the oxide material may include at least one selected from Zn oxide, Ti oxide, Sn oxide, and Zr oxide.

The optoelectronic device may further include a hole transport layer between the first electrode and the active layer.

The hole transport layer may include an organic semiconductor.

The hole transport layer may be in direct contact with the active layer.

The molecular interlayer may be a first molecular interlayer, and the optoelectronic device may further include a second molecular interlayer between the hole transport layer and the active layer.

The optoelectronic device may further include a hole injection layer between the first electrode and the hole transport layer.

The optoelectronic device may further include an electron injection layer between the second electrode and the electron transport layer.

The quantum dot may include at least one selected from a group II-VI based semiconductor, a group III-V based semiconductor, a group IV-VI based semiconductor, a group IV based semiconductor, and a graphene quantum dot.

The active layer may be a light-emitting layer, and the optoelectronic device is a light-emitting device.

The active layer may be a photoactive layer, and the optoelectronic device may be a light-receiving device.

According to another aspect of an exemplary embodiment, an optoelectronic device includes a first electrode; a second electrode spaced apart from the first electrode; an active layer between the first and second electrodes, the active layer including a quantum dot; a hole transport layer between the active layer and the first electrode, the hole transport layer including an organic semiconductor; an electron transport layer between the active layer and the second electrode, the electron transport layer including an inorganic semiconductor and having a first surface charge; and a molecular interlayer between the electron transport layer and the active layer, the molecular interlayer including organic molecules and having a second surface charge less than the first surface charge.

The molecular interlayer may include a hydrophobic material.

The molecular interlayer may include a nonionic material.

The molecular interlayer may include TCNQ.

A conduction band minimum energy level ($E_C$) of the molecular interlayer may be greater than or equal to an $E_C$ of the active layer and smaller than or equal to an $E_C$ of the electron transport layer.

The inorganic semiconductor may include at least one selected from Zn oxide, Ti oxide, Sn oxide, and Zr oxide.

The organic semiconductor may include at least one selected from TFB, CBP, TPD, PVK, TCTA, NPD, PFB, and F8T2. Compounds of TFB, CBP, TPD, PVK, TCTA, NPD, PFB, and F8T2 are described below:

TFB: poly(9,9-dioctylfluorene-co-N-(4-butylphenyl)diphenylamine)
CBP: 4,4'-bis(carbazol-9-yl)biphenyl
TPD: N,N'-bis(3-methyphenyl)-N,N'-diphenylbenzidine
PVK: poly(N-vinylcarbazole)
TCTA: tris(4-carbazoyl-9-ylphenyl)amine
NPD: N,N'-diphenyl-N,N'-bis(1-naphthyl)-1,1'biphenyl-4,4diamine
PFB: poly(9,9-dioctylfluorene-co-bis-N,N-phenyl-1,4-phenylenediamine
F8T2: poly(9,9-dioctylfluorene-co-bithiophene)

The electron transport layer may include ZnO, and the molecular interlayer may include TCNQ.

The optoelectronic device may further include a hole injection layer between the first electrode and the hole transport layer.

The optoelectronic device may further include an electron injection layer between the second electrode and the electron transport layer.

BRIEF DESCRIPTION OF THE DRAWINGS

These and/or other aspects will become apparent and more readily appreciated from the following description of the exemplary embodiments, taken in conjunction with the accompanying drawings in which:

FIG. 1 is a cross-sectional view of an optoelectronic device according to an exemplary embodiment;

FIG. 11 is a cross-sectional view of an optoelectronic device according to another aspect of an exemplary embodiment;

FIG. 12 is a cross-sectional view of an optoelectronic device according to another aspect of an exemplary embodiment;

FIG. 13 is a cross-sectional view of an optoelectronic device according to another aspect of an exemplary embodiment;

FIG. 14 is a cross-sectional view of an optoelectronic device according to another aspect of an exemplary embodiment.

DETAILED DESCRIPTION

Figure 2:
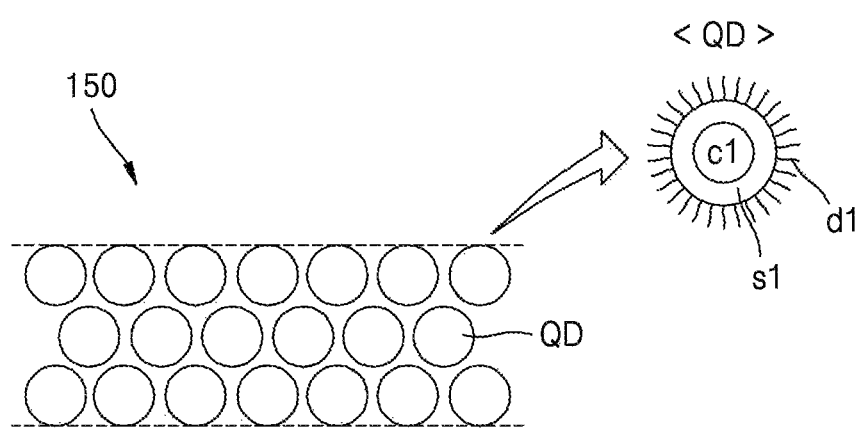
FIG. 2 is an exemplary cross-sectional view of a quantum dot-containing layer that may be used in an optoelectronic device according to an exemplary embodiment.

Various exemplary embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted region to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

Hereinafter, optoelectronic devices according to exemplary embodiments will be described with reference to the accompanying drawings. Widths or thicknesses of layers and regions shown in the accompanying drawings may be exaggerated for clarity and convenience of description. Like reference numerals denote like elements throughout the specification.

FIG. 1 is a cross-sectional view of an optoelectronic device according to an exemplary embodiment.

Referring to FIG. 1, the optoelectronic device may include an anode 100 and a cathode 200 that is spaced apart from the anode 100. The anode 100 and the cathode 200 may be respectively referred to as a first electrode and a second electrode. The anode 100 may include, for example, a transparent electrode material such as indium tin oxide (ITO), or other materials such as aluminum (Al), silver (Ag), gold (Au), carbon nanotube (CNT), graphene, or the like. The cathode 200 may include, for example, aluminum (Al), molybdenum (Mo), silver (Ag), gold (Au), calcium (Ca), barium (Ba), ITO, CNT, graphene, or the like. However, the aforementioned materials of the anode 100 and the cathode 200 are exemplary, and thus, various types of metal, conductive compounds (oxides), and the like, may be used as a material of the anode 100 or the cathode 200.

An active layer 150 may be provided between the anode 100 and the cathode 200. The active layer 150 may include a quantum dot (QD). The quantum dot of the active layer 150 may be formed by using, for example, a colloidal solution, i.e., a colloidal suspension. Accordingly, the quantum dot may be a colloidal quantum dot. The quantum dot may be a nano-sized structure formed of a semiconductor, for instance, an inorganic semiconductor. The quantum dot may have a diameter of tens of nm or less, for example, about 10 nm or less. The quantum dot may include at least one selected from, for example, a group II-VI based semiconductor, a group III-V based semiconductor, a group IV-VI based semiconductor, a group IV based semiconductor, and a graphene quantum dot. In particular, the quantum dot may include a group II-VI based semiconductor including ZnS, ZnSe, ZnTe, CdS, CdSe, CdTe, and the like, a group III-V based semiconductor including InP, GaAs, GaP, and the like, a group IV-VI based semiconductor including PbSe, PbTe, PbS, and the like, and a group IV based semiconductor including Si, Ge, and the like. Also, the quantum dot may have a core-shell structure with a core and a shell, or a shell-less particle structure (i.e., a core only structure). The core-shell structure may be a single-shell or multi-shell structure. The multi-shell structure may be, for example, a double-shell structure. Also, the quantum dot may include an alloy, and in some cases, may be doped with a dopant. An organic ligand or an inorganic ligand may be provided on a surface of the quantum dot. The quantum dot and the active layer 150 including the quantum dot will be described below with reference to FIG. 2.

An electron transport layer (ETL) 170 may be provided between the active layer 150 and the cathode 200. The ETL 170 may include an inorganic semiconductor. The inorganic semiconductor may include an n-type semiconductor. The inorganic semiconductor may be an oxide material or a non-oxide material. In this case, the oxide material may include one selected from, for example, Zn oxide ($ZnO_x$), Ti oxide ($TiO_x$), Sn oxide ($SnO_x$), and Zr oxide ($ZrO_x$), or a mixture of at least two materials therefrom. The Zn oxide may be ZnO, the Ti oxide may be $TiO_2$, the Sn oxide may be $SnO_2$, and the Zr oxide may be $ZrO_2$. The non-oxide material may include, for example, n-GaN. The aforementioned materials of the inorganic semiconductor are exemplary, and thus, other various types of inorganic semiconductor materials may be included. In order to manufacture a highly efficient optoelectronic device, it may be more beneficial for the ETL 170 to be formed by using an inorganic semiconductor, rather than forming the ETL 170 by using an organic semiconductor. However, the ETL 170 is not limited to an inorganic semiconductor. In some cases, the ETL 170 may be formed by using an n-type organic semiconductor.

The ETL 170 may be formed as a general thin film, or have a layer structure configured of a plurality of nanostructures. The plurality of nanostructures may include, for example, nanoparticles. The ETL 170 may be in an amorphous phase or a polycrystalline phase, or in some cases, in a mixed phase of the amorphous phase and the polycrystalline phase. When the ETL 170 is formed by using an inorganic semiconductor, a relatively large number of dangling bonds may be formed on a surface of the ETL 170. In this regard, the ETL 170 may have a relatively high surface charge density.

A molecular interlayer (i.e., molecular interface layer) 160 may be provided between the ETL 170 and the active layer 150. The molecular interlayer 160 may be an organic material layer including organic molecules. Also, the molecular interlayer 160 may have a smaller amount of surface charge than the ETL 170. The molecular interlayer 160 may have a very small amount of surface charge relative to the surface charge of the ETL 170. For example, a surface charge amount of the molecular interlayer 160 may be less than or equal to about ⅕ or about ⅒ of a surface charge amount of the ETL 170. The molecular interlayer 160 may be a nonionic material layer. The term 'nonionic' may refer to a state in which there is no or very low surface charge or a very small amount of ions. Also, the molecular interlayer 160 may be a hydrophobic material layer. Compared to the ETL 170, the molecular interlayer 160 may be hydrophobic. The ETL 170 may be hydrophilic or nearly hydrophilic, and the molecular interlayer 160 may be hydrophobic or nearly hydrophobic. In relation to this, the molecular interlayer 160 may have a different electric property from the ETL 170. The molecular interlayer 160 may include a low molecular material, e.g., a monomer, dimer, or oligomer, or a high molecular material, e.g., a polymer. For example, the molecular interlayer 160 may include tetracyanoquinodimethane (TCNQ). The molecular interlayer 160 may be a TCNQ layer. TCNQ may be $C_{12}H_4N_4$. However, a material of the molecular interlayer 160 is not limited to TCNQ, and other various types of low molecular or high molecular materials may be used.

The molecular interlayer 160 may prevent or restrain undesired charge transfer or charge recombination between the ETL 170 and the active layer 150. The ETL 170 may have a relatively large amount of surface charge, and a surface property of the ETL 170 may not be easily controlled. Therefore, when the ETL 170 directly contacts the active layer 150, an unnecessary charge transfer or charge recombination may occur between the ETL 170 and the active layer 150, and as a result, photoelectric conversion efficiency of the optoelectronic device may decrease. Also, radicals generated in the ETL 170 may deteriorate the quantum dot of the active layer 150. Accordingly, durability and stability of the optoelectronic device may decrease. However, as described according to the present exemplary embodiment, when the molecular interlayer 160 is provided between the active layer 150 and the ETL 170, an interface property between the active layer 150 and the ETL 170 may be improved due to the molecular interlayer 160. The molecular interlayer 160 may screen the ETL 170 with respect to the active layer 150. Because the molecular interlayer 160 may have no surface charge, or may have a very small amount of surface charge compared to the ETL 170, problems such as undesired charge recombination occurring between the active layer 150 and the molecular interlayer 160 may be prevented or restrained. Also, because a surface state of the molecular interlayer 160 may be excellent, the interface property between the active layer 150 and the molecular interlayer 160 may also be excellent. Also, the molecular interlayer 160 may prevent or restrain the radicals generated in the ETL 170 from deteriorating the active layer 150. Therefore, according to the present exemplary embodiment, an optoelectronic device (optoelectronic device including a quantum dot) with excellent performance, high photoelectric conversion efficiency, and improved durability and stability may be implemented.

A hole transport layer (HTL) 120 may be further provided between the active layer 150 and the anode 100. The HTL 120 may include an organic semiconductor. The organic semiconductor may be a p-type semiconductor. The organic semiconductor may include a low molecular-based or high molecular-based organic material. For example, the organic semiconductor may include at least one selected from TFB, CBP, TPD (or poly-TPD), PVK, TCTA, NPD, PFB, and F8T2. Compounds of TFB, CBP, TPD, PVK, TCTA, NPD, PFB, and F8T2 are described below:

TFB: poly(9,9-dioctylfluorene-co-N-(4-butylphenyl)diphenylamine)
CBP: 4,4'-bis(carbazol-9-yl)biphenyl
TPD: N,N'-bis(3-methylphenyl)-N,N'-diphenylbenzidine
PVK: poly(N-vinylcarbazole)
TCTA: tris(4-carbazoyl-9-ylphenyl)amine
NPD: N,N'-diphenyl-N,N'-bis(1-naphthyl)-1,1'biphenyl-4,4diamine
PFB: poly(9,9-dioctylfluorene-co-bis-N,N'-phenyl-1,4-phenylenediamine
F8T2: poly(9,9-dioctylfluorene-co-bithiophene)

However, the aforementioned materials of the HTL 120 are exemplary, and thus various other materials may be used as a material of the HTL 120. In some cases, the HTL 120 may be formed by using an inorganic semiconductor (p-type inorganic semiconductor).

When the HTL 120 includes an organic semiconductor, the HTL 120 may directly contact the active layer 150. Even when the HTL 120 directly contacts the active layer 150, a relatively good interface property may be obtained between the HTL 120 and the active layer 150, and thus, a highly efficient optoelectronic device may be manufactured. However, as described above, the HTL 120 may include an inorganic semiconductor. In this case, a molecular layer (a second molecular interlayer) (not shown) may be further provided between the HTL 120 and the active layer 150. Even when the HTL 120 includes an organic semiconductor, if necessary, the molecular layer (the second molecular interlayer) may be further provided between the HTL 120 and the active layer 150.

A hole injection layer (HIL) 110 may be further provided between the HTL 120 and the anode 100. The HIL 110 may include an organic semiconductor or an inorganic semiconductor. For example, the HIL 110 may include an organic semiconductor such as PEDOT or PEDOT:PSS. PEDOT may be poly(3,4-ethylenedioxythiophene), and PEDOT:PSS may be poly(3,4-ethylenedioxythiophene):polystyrene sulfonate. Alternatively, the HIL 110 may include an inorganic semiconductor such as $MoO_3$, NiO, and $WO_3$. However, the aforementioned materials of the HIL 110 are exemplary, and thus various other materials may be used as a material of the HIL 110. Any general hole injection material that is used in the field of optoelectronic devices may be used as the material of the HIL 110. When electric conductivity of the HIL 110 is high, the HIL 110 may be regarded as a portion of the anode 100. In some cases, the HIL 110 may be omitted. In this case, the HTL 120 may also function as the HIL 110.

The quantum dot-containing layer (i.e., the active layer 150) that may be used in the optoelectronic device described with reference to FIG. 1 may have, for example, a structure as shown in FIG. 2. That is, FIG. 2 is an exemplary cross-sectional view of the quantum dot-containing layer (i.e., the active layer 150) that may be used in the optoelectronic device of FIG. 1.

Referring to FIG. 2, a quantum dot-containing layer 150 may include a plurality of quantum dots QD. The plurality of quantum dots QD may form a single-layer structure or a multi-layer structure. Each of the quantum dots QD may have a core portion c1 and a shell portion s1. The shell portion s1 may have a single-shell structure or a multi-shell structure. Each of the quantum dots QD may have a diameter of about 1 nm to tens of nm. A ligand d1 may be on a surface of each of the quantum dots QD. The ligand d1 may be an organic ligand or an inorganic ligand. Each of the quantum dots QD may be colloidal quantum dots.

Each of the quantum dots QD may include, for example, at least one selected from, for example, a group II-VI based semiconductor, a group III-V based semiconductor, a group IV-VI based semiconductor, a group IV based semiconductor, and a graphene quantum dot. The group II-VI based semiconductor may include one selected from, for example, a binary compound such as ZnS, ZnSe, ZnTe, CdS, CdSe, CdTe, ZnO, HgS, HgSe, and HgTe; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe; a quaternary compound such as CdHgZnTe, CdZnSeS, CdZnSeTe, CdZnSTe, CdHgSeS, CdHgSeTe, CdHgSTe, HgZnSeS, HgZnSeTe, and HgZnSTe; and a combination thereof. The group III-V based semiconductor may include one selected from, for example, a binary compound such as GaN, GaP, GaAs, GaSb, AlN, AlP, AlAs, AlSb, InN, InP, InAs, and InSb; a ternary compound such as GaNP, GaNAs, GaNSb, GaPAs, GaPSb, AlNP, AlNAs, AlNSb, AlPAs, AlPSb, InNP, InNAs, InNSb, InPAs, and InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; and a combination thereof. The group IV-VI based semiconductor may include one selected from, for example, a binary compound such as SnS, SnSe, SnTe, PbS, PbSe, and PbTe; a ternary compound such as SnSeS, SnSeTe, SnSTe, PbSeS, PbSeTe, PbSTe, SnPbS, SnPbSe, and SnPbTe; a quaternary compound such as SnPbSSe, SnPbSeTe, and SnPbSTe; and a combination thereof. The group IV based semiconductor may include, for example, Si, Ge, SiGe, SiC, or a combination thereof. The graphene quantum dot may be a quantum dot including graphene.

Although FIG. 2 illustrates a case where the quantum dots QD have a single-shell type core-shell structure, the quantum dots QD may have a shell-less particle structure (i.e., a core only structure) or a multi-shell structure including a plurality of shells. For example, when the quantum dot QD has a shell-less particle structure, the quantum dot QD may be formed of CdSe, InP, or the like. When the quantum dot QD has a single-shell type core-shell structure, the quantum dot QD may have a CdSe/CdS (core/shell) structure, an InP/ZnS (core/shell) structure, or the like. When the quantum dot QD has a core-shell-shell structure including a double-shell, the quantum dot QD may have, for example, a CdSe/CdS/ZnS (core/shell/shell) structure. However, the aforementioned materials and combinations are exemplary, and other various material combinations may be used. Also, in some cases, an alloy may be formed between a core portion and a shell portion, and the quantum dot QD may be doped with a dopant.

Figure 3:
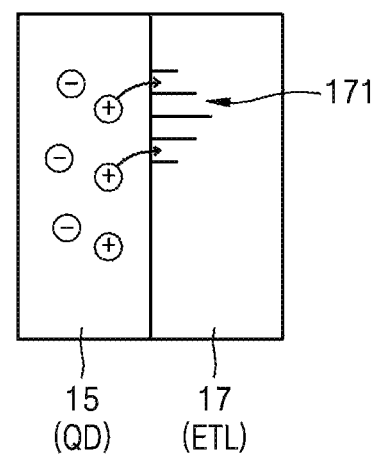
FIG. 3 is a cross-sectional view for describing a stack structure applied to an optoelectronic device according to a comparative example and a problem of the stack structure.

FIG. 3 is a cross-sectional view for describing a stack structure applied to an optoelectronic device according to a comparative example and a problem of the stack structure.

Referring to FIG. 3, the optoelectronic device according to the comparative example may contact an active layer 15 including a quantum dot QD and an ETL 17. The ETL 17 may have a relatively large amount of surface charge. Lines 171 on a surface of the ETL 17 indicate a surface trap caused by surface defects. In particular, when the ETL 17 includes an inorganic semiconductor, the inorganic semiconductor may include an amorphous phase, and have a relatively large number of dangling bonds on the surface. In this regard, the ETL 17 may have a relatively high surface charge density. Also, a relatively large amount of defects may be formed on the surface of the ETL 17. Therefore, when the active layer 15 contacts the surface of the ETL 17, undesired charge transfer and charge recombination may occur at an interface between the active layer 15 and the ETL 17. For example, a hole of the active layer 15 may combine with surface charge (electrons) of the ETL 17, and thus photoelectric conversion efficiency of the active layer 15 may decrease. Also, when the ETL 17 contacts the active layer 15, radicals generated in the ETL 17 may deteriorate a quantum dot property of the active layer 15. Thus, durability, stability, and lifespan of the optoelectronic device may decrease. In other words, efficiency of the optoelectronic device may rapidly decrease due to surface deterioration at the interface between the active layer 15 and the ETL 17.

Figure 4:
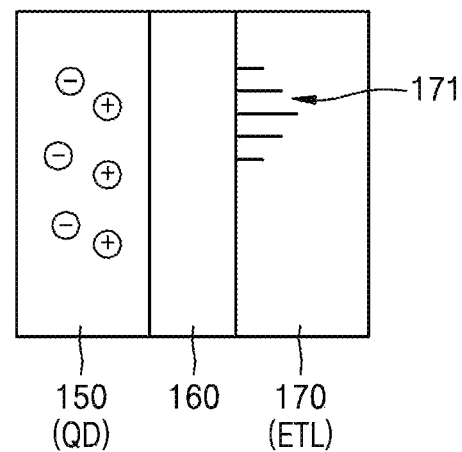
FIG. 4 is a cross-sectional view of a stack structure applied to an optoelectronic device according to an exemplary embodiment and features of the stack structure.

FIG. 4 is a cross-sectional view of a stack structure applied to an optoelectronic device according to an exemplary embodiment and features of the stack structure.

Referring to FIG. 4, the optoelectronic device according to an exemplary embodiment may include the molecular interlayer 160 between the active layer 150 and the ETL 170. The molecular interlayer 160 may be an organic material layer including organic molecules. Also, the molecular interlayer 160 may have a smaller amount of surface charge than the ETL 170. The molecular interlayer 160 may be a nonionic material layer. Also, the molecular interlayer 160 may be a hydrophobic material layer. The molecular interlayer 160 may prevent or restrain undesired charge transfer or charge recombination between the ETL 170 and the active layer 150. In other words, a screening effect due to the molecular interlayer 160 may be provided.

When the molecular interlayer 160 is provided between the active layer 150 and the ETL 170, some of surface charges of the ETL 170 may transfer to the molecular interlayer 160, and thus, a state of the molecular interlayer 160 may change or be stabilized. In this case, the molecular interlayer 160 may nearly not take charge from the active layer 150. In other words, undesired charge transfer or charge recombination may be reduced between the molecular interlayer 160 and the active layer 150. Also, the molecular interlayer 160 may prevent or restrain the radicals generated in the ETL 170 from deteriorating the active layer 150.

However, the molecular interlayer 160 may not hinder transfer of electrons via the ETL 170 when the optoelectronic device operates. In the case that the optoelectronic device is a light-emitting device, when voltage is applied between two electrodes (the anode 100 and the cathode 200 of FIG. 1), electrons are supplied to the active layer 150 via the ETL 170, and the molecular interlayer 160 may be configured to not hinder the supply (transfer) of electrons. To do so, an energy level of the molecular interlayer 160, for example, a conduction band minimum energy level ($E_C$) of the molecular interlayer 160, or a thickness of the molecular interlayer 160, may be adjusted. This will be described below with reference to FIGS. 6 and 7.

Figure 5:
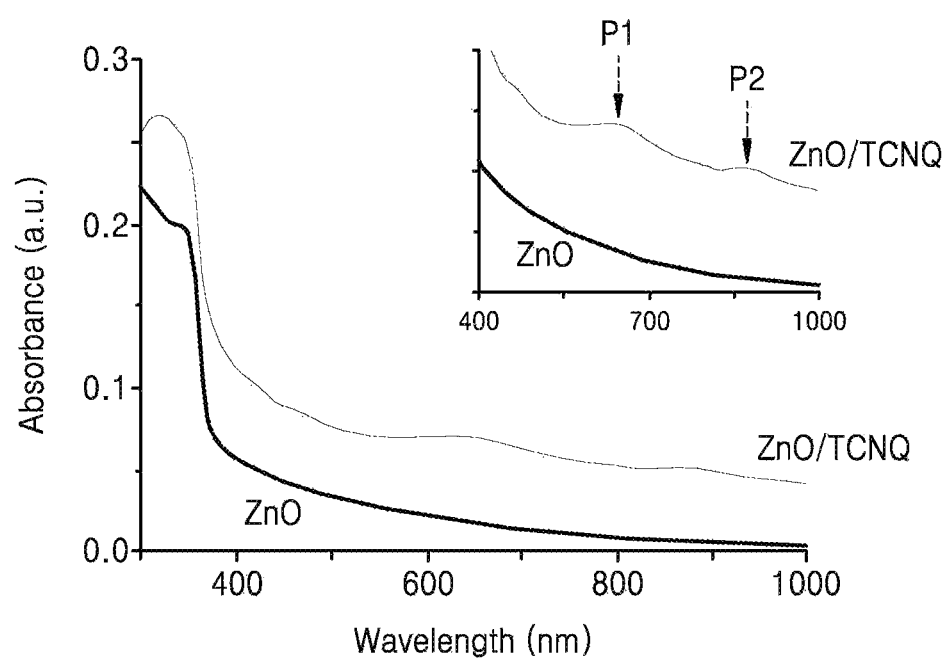
FIG. 5 is a graph of an absorption spectrum according to wavelengths with respect to a ZnO layer and a ZnO/tetracyanoquinodimethane (TCNQ) stack.

FIG. 5 is a graph of an absorption spectrum according to wavelength with respect to a ZnO layer and a ZnO/TCNQ stack. An effect of a TCNQ layer on a ZnO layer when the TCNQ layer contacts the ZnO layer may be identified based on the present experimental result. The ZnO layer may be an example of an ETL, and the TCNQ layer may be an example of a molecular interlayer. A small graph at an upper right side of FIG. 5 shows a result obtained in a wavelength band of 400 nm to 1,000 nm in another scale.

A graph in FIG. 5 corresponding to the ZnO layer (hereinafter, referred to as 'first graph') and a graph in FIG. 5 corresponding to the ZnO/TCNQ stack (hereinafter, referred to as 'second graph') are compared as below. The two graphs have different forms. In particular, within a wavelength band of about 600 nm to 700 nm and a wavelength band of about 850 nm to 900 nm, the second graph (ZnO/TCNQ) has two peaks P1 and P2 that do not exist in the first graph (ZnO). This result may be caused by the charge transfer from the ZnO layer to the TCNQ layer when the TCNQ layer contacts the ZnO layer. That is, the peaks P1 and P2 formed within the wavelength band of about 600 nm to 700 nm and the wavelength band of about 850 nm to 900 nm may be caused, respectively, by "charge transfer states." As described above with reference to FIG. 4, this may be due to the partial transfer of surface charge from the ETL 170 to the molecular interlayer 160.

Figure 6:
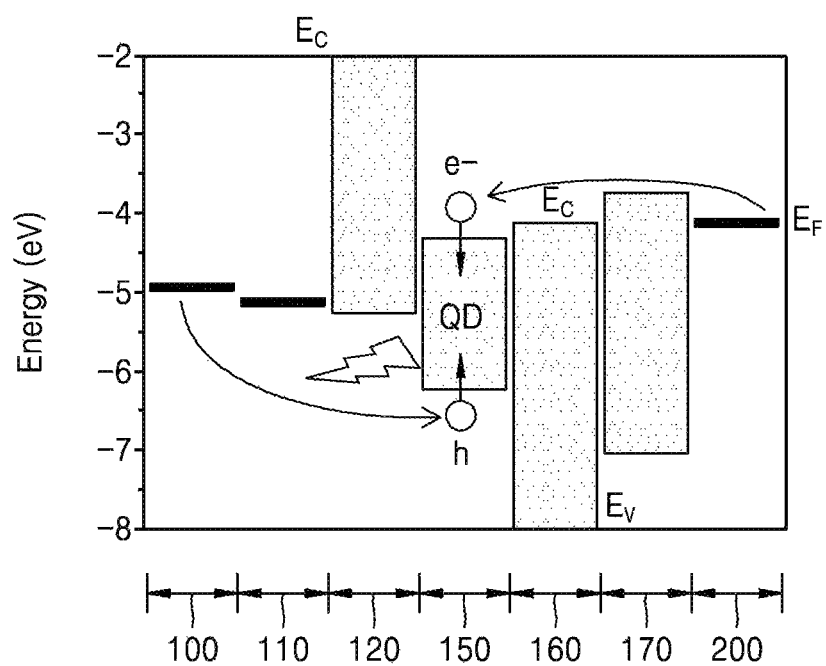
FIG. 6 is an exemplary energy band diagram of an optoelectronic device, according to an exemplary embodiment.
Figure 7:
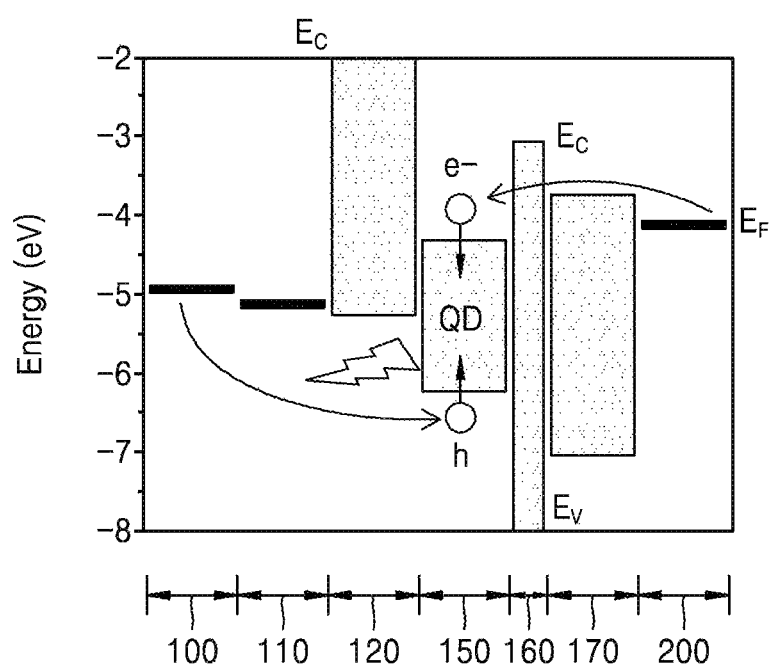
FIG. 7 is an exemplary energy band diagram of an optoelectronic device, according to another aspect of an exemplary embodiment.

FIG. 6 is an exemplary energy band diagram of an optoelectronic device, according to an exemplary embodiment. In FIG. 6, '$E_V$' and '$E_C$' respectively refer to a valence band maximum energy level and a conduction band minimum energy level, and '$E_F$' refers to a Fermi energy level. '$E_V$,' '$E_C$,' and '$E_F$' in FIG. 7 refer to the same terms as in FIG. 6. The description below with reference to FIGS. 6 and 7 is directed to a case where the optoelectronic device is a light-emitting device.

Referring to FIG. 6, an $E_C$ of the molecular interlayer 160 may be greater than or equal to an $E_C$ of the active layer 150 and smaller than or equal to an $E_C$ of the ETL 170. The $E_C$ of the molecular interlayer 160 may be greater than the $E_C$ of the active layer 150 and smaller than the $E_C$ of the ETL 170. In this case, even when the molecular interlayer 160 has a thickness of about 10 nm or more, charge (electrons) may easily transfer via the molecular interlayer 160. The molecular interlayer 160 may have a thickness of about 10 nm to about 100 nm. However, the thickness of the molecular interlayer 160 is not limited thereto. In some cases, the thickness of the molecular interlayer 160 may be about 10 nm or less or about 100 nm or more.

An $E_V$ of the molecular interlayer 160 may be smaller than an $E_V$ of the active layer 150. Also, the $E_V$ of the molecular interlayer 160 may be smaller than an $E_V$ of the ETL 170. In this case, a hole blocking property may be improved by the molecular interlayer 160.

When the optoelectronic device is a light-emitting device, a positive (+) voltage (+V) may be applied to the anode 100, and a negative (−) voltage (−V) may be applied to the cathode 200. Due to such voltage application, electrons e− and holes h may be injected to the active layer 150, and light of a certain wavelength band may be emitted as the electrons and the holes combine.

FIG. 7 is an exemplary energy band diagram of an optoelectronic device, according to another aspect of an exemplary embodiment.

Referring to FIG. 7, an $E_C$ of the molecular interlayer 160 may be greater than an $E_C$ of the ETL 170. In this case, the molecular interlayer 160 may be thin to allow tunneling of electrons. For example, the thickness of the molecular interlayer 160 may be about 10 nm or less. In this case, even when the $E_C$ of the molecular interlayer 160 is greater than the $E_C$ of the ETL 170, electrons may easily transfer (tunneling) via the molecular interlayer 160. Also, an $E_V$ of the molecular interlayer 160 may be smaller than an $E_V$ of the ETL 170.

The energy band diagrams shown in FIGS. 6 and 7 are exemplary, and the energy band diagrams may be modified in various ways. Also, relative thickness of material layers (100, 110, 120, 150, 160, 170, and 200) in FIGS. 6 and 7 are exemplary, and the relative thicknesses may be modified in various ways.

Figure 8:
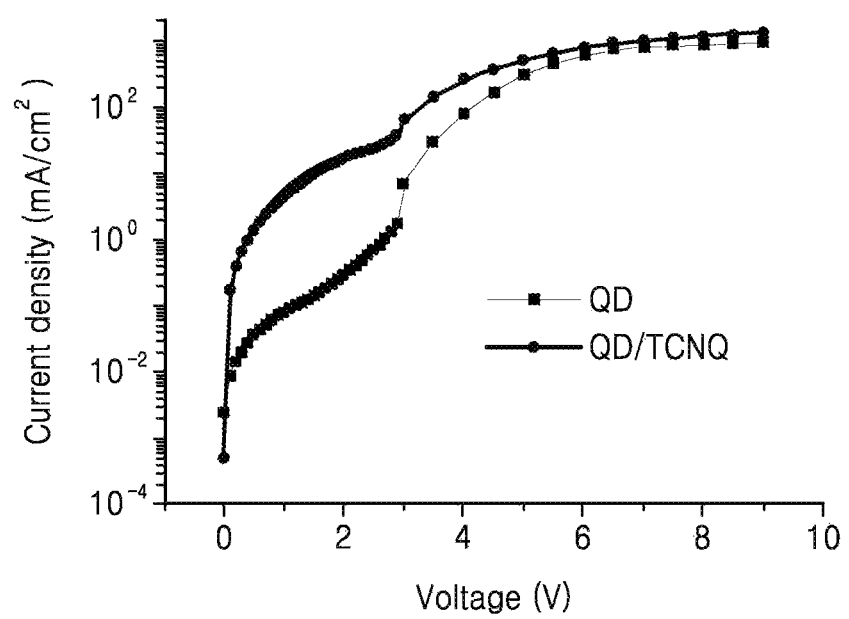
FIG. 8 is a graph of voltage-current density characteristic of optoelectronic devices according to an exemplary embodiment and a comparative example.

FIG. 8 is a graph of voltage-current density characteristic of optoelectronic devices (quantum dot light-emitting devices) according to an exemplary embodiment (QD/TCNQ) and a comparative example (QD). The optoelectronic device (quantum dot light-emitting device) according to an exemplary embodiment includes an active layer including a quantum dot QD and a molecular interlayer including TCNQ. That is, the optoelectronic device according to an exemplary embodiment is a case where the structure is as shown in FIG. 1 and TCNQ is used as the molecular interlayer 160. The optoelectronic device (quantum dot light-emitting device) according to the comparative example has the structure of FIG. 1 without the molecular interlayer 160. That is, the comparative example is according to the optoelectronic device that includes the active layer 150 including the quantum dot QD without the molecular interlayer 160.

Referring to FIG. 8, the optoelectronic device according to an exemplary embodiment, i.e., the optoelectronic device including the molecular interlayer, has a higher current density than the optoelectronic device according the comparative example, i.e., the optoelectronic device without the molecular interlayer. Accordingly, high current density may be obtained when the molecular interlayer is included.

Figure 9:
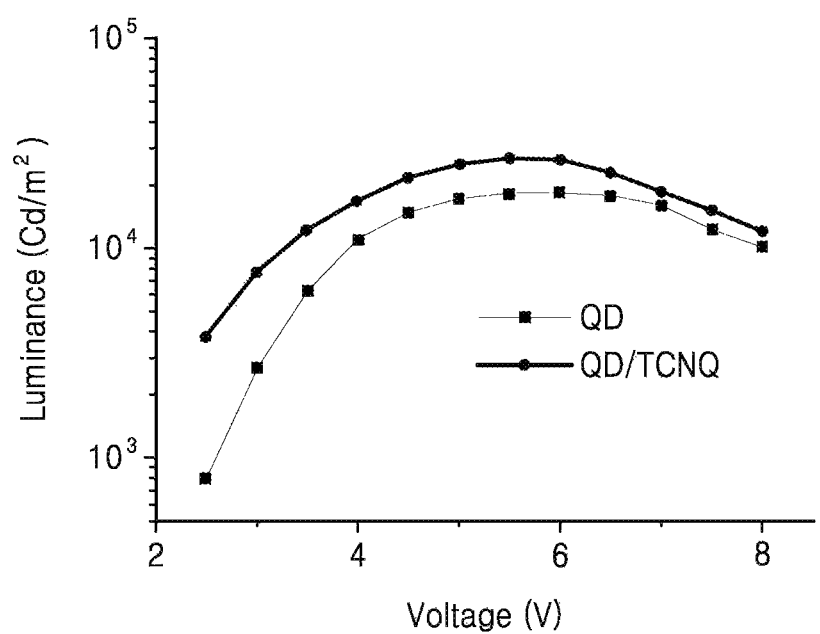
FIG. 9 is a graph of voltage-luminance characteristic of the optoelectronic devices according to an exemplary embodiment and a comparative example.

FIG. 9 is a graph of voltage-luminance characteristic of the optoelectronic devices (quantum dot light-emitting devices) according to an exemplary embodiment (QD/TCNQ) and a comparative example (QD). The optoelectronic devices (quantum dot light-emitting devices) according to the exemplary embodiment and the comparative example are configured in the same manner as those described with reference to FIG. 8.

Referring to FIG. 9, the optoelectronic device according to an exemplary embodiment, i.e., the optoelectronic device including the molecular interlayer, has higher luminance than the optoelectronic device according to the comparative example, i.e., the optoelectronic device without the molecular interlayer. Accordingly, high luminance may be obtained when the molecular interlayer is included.

Figure 10:
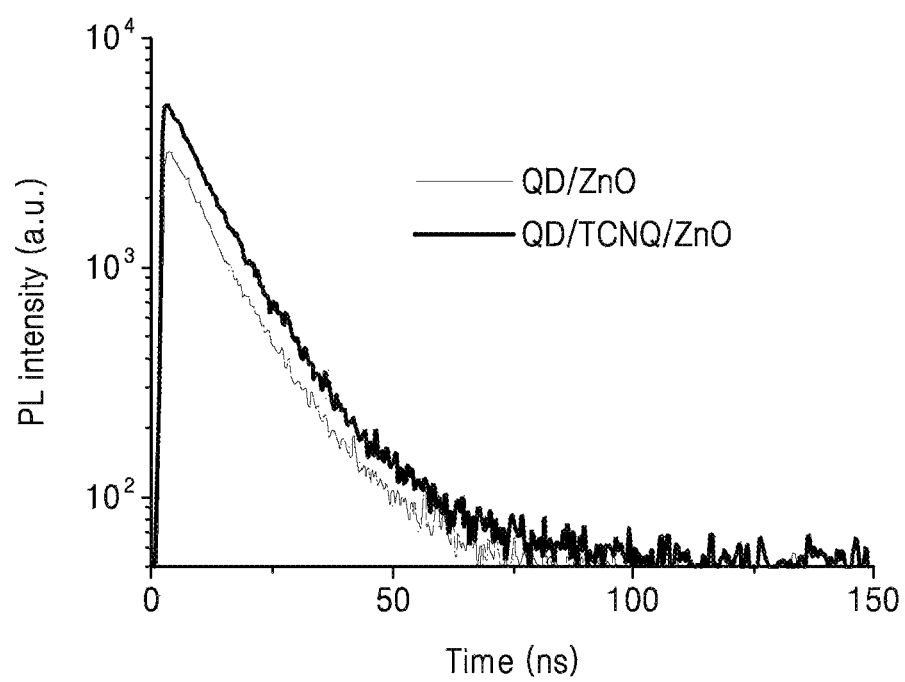
FIG. 10 is a graph showing changes in photoluminescence (PL) intensity of stack structures that may be applied to the optoelectronic devices with passing time, according to an exemplary embodiment and a comparative example.

FIG. 10 is a graph showing changes in photoluminescence (PL) intensity over time, with regard to stack structures that may be applied to the optoelectronic devices according to an exemplary embodiment (QD/TCNQ/ZnO) and a comparative example (QD/ZnO). The comparative example includes a quantum dot layer (QD layer) and a ZnO layer (ETL) that contacts the QD layer (i.e., QD/ZnO), and the exemplary embodiment includes a TCNQ layer (molecular interlayer) between a quantum dot layer (QD layer) and a ZnO layer (ETL) (i.e., QD/TCNQ/ZnO). That is, changes in PL intensities of a QD/ZnO structure (comparative example) and a QD/TCNQ/ZnO structure (exemplary embodiment) with the passage of time have been estimated.

Referring to FIG. 10, an initial PL intensity of a graph of the QD/TCNQ/ZnO structure (exemplary embodiment) is higher than an initial PL intensity of a graph of the QD/ZnO structure (comparative example). Also, overall, the graph of the QD/TCNQ/ZnO structure (exemplary embodiment) is located above the graph of the QD/ZnO structure (comparative example). These results indicate that the QD/TCNQ/ZnO structure according to an exemplary embodiment has a higher PL intensity and a longer PL lifetime than the QD/ZnO structure according to the comparative example. Therefore, optoelectric properties may be improved when a molecular interlayer is included between a quantum dot layer and an ETL.

Based on the results shown in FIGS. 8 to 10, the optoelectronic device according to an exemplary embodiment has better performance than the optoelectronic device according to the comparative example. Also, durability and stability of the optoelectronic device according to an exemplary embodiment have been improved. Although FIGS. 8 to 10 describe a case where ZnO and TCNQ are used, similar effects may be obtained even when other materials are used.

FIG. 11 is a cross-sectional view of an optoelectronic device according to another aspect of an exemplary embodiment. A structure of the present exemplary embodiment is a modification of the structure of FIG. 1.

Referring to FIG. 11, a second molecular interlayer 130 may be further provided between the HTL 120 and the active layer 150. The second molecular interlayer 130 may improve an interface property between the HTL 120 and the active layer 150. The second molecular interlayer 130 may include a material different from that of the molecular interlayer 160 (first molecular interlayer) between the active layer 150 and the ETL 170. The second molecular interlayer 130 may have a different property from the molecular interlayer 160. For example, an $E_V$ of the second molecular interlayer 130 may be smaller than or equal to an $E_V$ of the HTL 120, and greater than or equal to the $E_V$ of the active layer 150. Here, the HTL 120 may include an inorganic semiconductor or an organic semiconductor. When the HTL 120 includes an inorganic semiconductor, an effect of the second molecular interlayer 130 may be greater. Because features other than the second molecular interlayer 130 may be similar to features of FIG. 1, the description of the similar features will not be repeated.

According to another aspect of an exemplary embodiment, an electron injection layer (EIL) may be added to the structure of FIG. 1, as shown in FIG. 12. Referring to FIG. 12, an EIL 180 may be further provided between the ETL 170 and the cathode 200. The EIL 180 may include, for example, LiF, CsF, NaF, CaF$_2$, Li$_2$O, Cs$_2$O, Na$_2$O, Li$_2$CO$_3$, Cs$_2$CO$_3$, Na$_2$CO$_3$, or the like. The EIL 180 may include an inorganic material or an organic material. Any material that may be used as an electron injection material in a general optoelectronic device may be included in the EIL 180.

According to another aspect of an exemplary embodiment, the HIL 110 may be omitted from the structure of FIG. 1, as shown in FIG. 13. Referring to FIG. 13, the anode 100 may contact the HTL 120 without the HIL.

According to another aspect of an exemplary embodiment, the HIL 110 and the HTL 120 may be omitted from the structure of FIG. 1, as shown in FIG. 14. Referring to FIG. 14, the HIL and the HTL may not be included, and the anode 100 may contact the active layer 150.

In addition, at least two features from among the structures of FIGS. 11 to 14 may be combined. For example, the EIL 180 of FIG. 12 may be included in the structure of FIG. 11, and the second molecular interlayer 130 of FIG. 11 may be included in the structure of FIG. 13. Other various modified structures may be possible.

Figure 15:
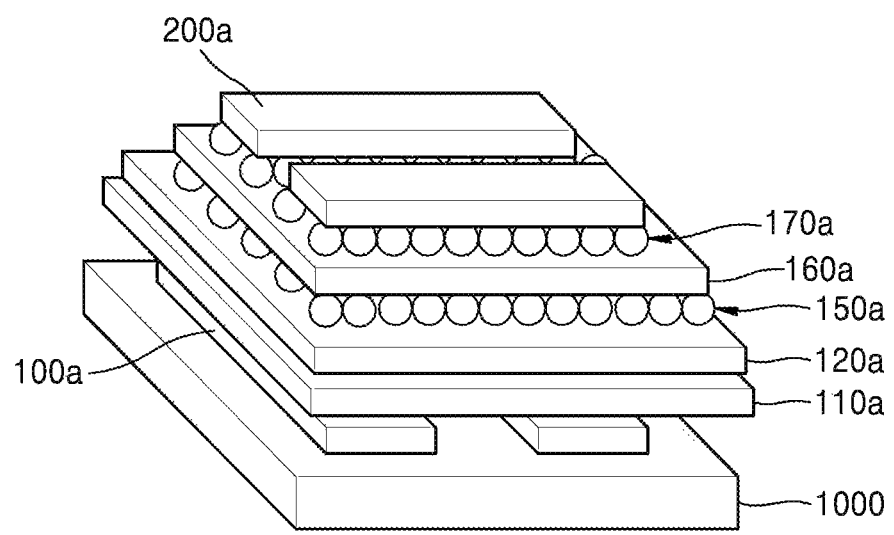
FIG. 15 is a perspective view of an optoelectronic device according to another aspect of an exemplary embodiment.

FIG. 15 is a perspective view of an optoelectronic device according to another aspect of an exemplary embodiment. A stack structure of FIG. 15 may correspond to a stack structure shown in FIG. 1.

Referring to FIG. 15, an anode 100a may be provided on a substrate 1000. The substrate 1000 may be a transparent substrate, for example, a glass substrate. Also, the substrate 1000 may be a flexible substrate or a rigid substrate. Various materials may be included in the substrate 1000. The anode 100a may include, for example, a transparent electrode material such as ITO, or other materials such as Al, Ag, Au, CNT, graphene, or the like. The anode 100a may be formed by using, for example, physical vapor deposition such as sputtering. In some cases, the anode 100a may have a patterned structure. A HIL 110a may be provided on the anode 100a. The HIL 110a may include, for example, an organic semiconductor such as PEDOT or PEDOT:PSS. Alternatively, the HIL 110a may include an inorganic semiconductor such as MoO$_3$, NiO, WO$_3$ or the like. The HIL 110a may be formed by spin coating, or by using other methods, for example, sol-gel, spray coating, blade coating, printing, deposition, or the like. A HTL 120a may be provided on the HIL 110a. The HTL 120a may include, for example, an organic semiconductor. In particular, the organic semiconductor may include at least one selected from TFB, CBP, TPD, PVK, TCTA, NPD, PFB, and F8T2. In some cases, the HTL 120a may include the inorganic semiconductor. The HTL 120a may be formed by spin coating, or by using other methods, for example, sol-gel, spray coating, blade coating, printing, deposition, or the like.

An active layer 150a including a quantum dot may be provided on the HTL 120a. The active layer 150a may be a quantum dot layer that includes a plurality of quantum dots. A material, a structure, a size, and the like of the quantum dot may be selected according to a desired wavelength band and properties. The active layer 150a may be formed by using various methods such as spin coating. A molecular interlayer 160a may be provided on the active layer 150a. The molecular interlayer 160a may be an organic material layer including organic molecules. Also, the molecular interlayer 160a may be a nonionic material layer or a hydrophobic material layer. The molecular interlayer 160a may include a low molecular material or a high molecular material. For example, the molecular interlayer 160a may include TCNQ. However, a material of the molecular interlayer 160a is not limited to TCNQ, and other various materials may be used. The molecular interlayer 160a may be formed by spin coating, or by using other various methods, for example, thermal evaporation or the like.

An ETL 170a may be provided on the molecular interlayer 160a. The ETL 170a may include an inorganic semiconductor. The inorganic semiconductor may be an oxide material or a non-oxide material. The oxide material may include one selected from, for example, Zn oxide (ZnO$_X$), Ti oxide (TiO$_X$), Sn oxide (SnO$_X$), and Zr oxide (ZrO$_X$), or a mixture of at least two selected therefrom. The non-oxide material may include, for example, n-GaN. The aforementioned materials of the inorganic semiconductor are exemplary, and thus, other various types of inorganic semiconductor materials may be included. When the ETL 170a is formed by using an inorganic semiconductor, it may be possible to manufacture a highly efficient optoelectronic device. However, in some cases, the ETL 170a may be formed by using an organic semiconductor. The ETL 170a may be formed as a general thin film, or have a layer structure configured of a plurality of nanostructures. The plurality of nanostructures may include, for example, nanoparticles. In the present exemplary embodiment, the ETL 170a is configured as a plurality of nanostructures (nanoparticles). The ETL 170a may have a relatively higher surface charge density than the molecular interlayer 160a. The ETL 170a may be formed by spin coating, or by using other various methods, for example, sol-gel, spray coating, blade coating, printing, deposition, or the like.

A cathode 200a may be provided on the ETL 170a. The cathode 200a may include, for example, Al, Mo, Ag, Au, Ca, Ba, ITO, CNT, graphene, and the like. The cathode 200a may be formed by using various methods such as deposition. When necessary, the cathode 200a may have a patterned structure. When the anode 100a has a structure extending in a first direction, the cathode 200a may have a structure extending in a second direction that is perpendicular to the first direction.

According to an exemplary embodiment, a thickness of the anode 100a may be about 200 nm, a thickness of the HIL 110a may be about 20 nm, a thickness of the HTL 120a may be about 40 nm, a thickness of the active layer 150a may be about 20 nm, a thickness of the ETL 170a may be about 40 nm, and a thickness of the cathode 200a may be about 150 nm. However, the aforementioned numbers are exemplary, and respective thicknesses of the layers may be modified in various ways. In addition, when necessary, a surface reforming process may be performed on the quantum dot of the active layer 150a. For example, the quantum dot of the active layer 150a may be processed with 1,7-heptadiamine or the like to change a surface property of the quantum dot. However, the aforementioned surface modification process may be optional.

The aforementioned structure of the optoelectronic device of FIG. 15 is exemplary, and the structure may be modified in various ways. For example, the structure of FIG. 15 may be modified to apply various modified structures of FIGS. 11 to 14. Also, the optoelectronic device according to an exemplary embodiment may have a mesa structure, i.e., such that the device is provided to stand up above the substrate.

The optoelectronic device according to one or more exemplary embodiments may be used as a light-emitting device. In this case, the optoelectronic device may be referred to as a 'quantum dot light-emitting device,' and the active layer 150 may be used as a light-emitting layer. The quantum dot light-emitting device may have a light emission wavelength in a visible ray band, a light emission wavelength in an infrared ray band, or the like. Alternatively, the optoelectronic device according to one or more exemplary embodiments may be used as a light-receiving device. In this case, the optoelectronic device may be a photovoltaic device such as a photodiode, a photodetector, or a solar cell. The active layer 150 in this case may be used as a photoactive layer. Also, the optoelectronic device according to one or more exemplary embodiments may be provided as a flexible device, a wearable device, or neither. Alternatively, in some cases, the optoelectronic device may be provided as a stretchable device.

In addition, the quantum dot QD used in the optoelectronic device according to one or more exemplary embodiments may have a dot-like shape, i.e., a spherical shape. However, in some cases, the quantum dot QD may have a one-dimensional shape of a rod or a wire, or a two-dimensional planar shape. A quantum structure with a rod shape may be referred to as a quantum-rod, and a quantum structure with a planar shape may be referred to as a quantum-plate. According to the present disclosure, the term 'quantum dot' may include a dot-like shape, a rod shape, a wire shape, a planar shape, and the like.

The aforementioned exemplary embodiments mainly describe cases where the molecular interlayers 130 and 160 are included between the active layer 150 and the ETL 170 or between the active layer 150 and the HTL 120. However, according to another aspect of an exemplary embodiment, various types of molecular interlayers may be included in at least one interface in the optoelectronic device to control a surface property and an energy level, and thus, the property of the optoelectronic device may be improved or controlled in various ways.

It should be understood that the exemplary embodiments described herein should be considered in a descriptive sense only and not for purposes of limitation. For example, it will be understood by those of ordinary skill in the art that various changes in form and details may be made in the device structures of FIGS. 1 and 11 to 15 and the energy band diagrams of FIGS. 6 and 7. In addition, the features of the exemplary embodiments may be applied not only to an optoelectronic device but also to other types of semiconductor devices. Therefore, the scope of the present disclosure is not limited to the aforementioned exemplary embodiments.

What is claimed is:

1. An optoelectronic device comprising:
a first electrode;
a second electrode spaced apart from the first electrode;
an active layer disposed between the first electrode and the second electrode, the active layer consisting substantially of quantum dots;
an electron transport layer disposed between the active layer and the second electrode, the electron transport layer having a first surface charge; and
a molecular interlayer disposed between the electron transport layer and the active layer, the molecular interlayer comprising organic molecules and having a second surface charge less than the first surface charge, and the molecular interlayer being in direct contact with the active layer.

2. The optoelectronic device of claim 1, wherein the molecular interlayer comprises a hydrophobic material or a nonionic material.

3. The optoelectronic device of claim 1, wherein the molecular interlayer comprises a low molecular material or a high molecular material.

4. The optoelectronic device of claim 1, wherein the molecular interlayer comprises tetracyanoquinodimethane (TCNQ).

5. The optoelectronic device of claim 1, wherein a conduction band minimum energy level ($E_C$) of the molecular interlayer is greater than or equal to an $E_C$ of the active layer and smaller than or equal to an $E_C$ of the electron transport layer.

6. The optoelectronic device of claim 1, wherein the electron transport layer comprises an inorganic semiconductor.

7. The optoelectronic device of claim 6, wherein the inorganic semiconductor comprises an oxide material or a non-oxide material, and
the oxide material comprises at least one selected from Zn oxide, Ti oxide, Sn oxide, and Zr oxide.

8. The optoelectronic device of claim 1, further comprising a hole transport layer disposed between the first electrode and the active layer.

9. The optoelectronic device of claim 8, wherein the hole transport layer comprises an organic semiconductor.

10. The optoelectronic device of claim 8, wherein the hole transport layer is in direct contact with the active layer.

11. The optoelectronic device of claim 8, wherein the molecular interlayer is a first molecular interlayer,
the optoelectronic device further comprises a second molecular interlayer disposed between the hole transport layer and the active layer, and
a valence band maximum energy level ($E_V$) of the second molecular interlayer is smaller than or equal to an $E_V$ of the hole transport layer and greater than or equal to an $E_V$ of the active layer.

12. The optoelectronic device of claim 8, further comprising a hole injection layer disposed between the first electrode and the hole transport layer, the hole injection layer comprising an organic or inorganic semiconductor different than a material of the hole transport layer.

13. The optoelectronic device of claim 1, further comprising an electron injection layer disposed between the second electrode and the electron transport layer, the electron injection layer comprising an inorganic or organic material different than a material of the electron transport layer.

14. The optoelectronic device of claim 1, wherein each of the quantum dots comprises at least one selected from a group II-VI based semiconductor, a group III-V based semiconductor, a group IV-VI based semiconductor, a group IV based semiconductor, and a graphene quantum dot.

15. The optoelectronic device of claim 1, wherein the active layer is a light-emitting layer, and
the optoelectronic device is a light-emitting device.

16. The optoelectronic device of claim 1, wherein the active layer is a photoactive layer, and
the optoelectronic device is a light-receiving device.

17. An optoelectronic device comprising:
a first electrode;
a second electrode spaced apart from the first electrode;
an active layer disposed between the first electrode and the second electrode, the active layer consisting substantially of quantum dots;
a hole transport layer disposed between the active layer and the first electrode, the hole transport layer comprising an organic semiconductor;
an electron transport layer disposed between the active layer and the second electrode, the electron transport layer comprising an inorganic semiconductor and having a first surface charge; and
a molecular interlayer disposed between the electron transport layer and the active layer, the molecular interlayer comprising organic molecules and having a second surface charge less than the first surface charge, and the molecular interlayer being in direct contact with the active layer.

18. The optoelectronic device of claim 17, wherein the molecular interlayer comprises a hydrophobic material or a nonionic material.

19. The optoelectronic device of claim 17, wherein the molecular interlayer comprises tetracyanoquinodimethane (TCNQ).

20. The optoelectronic device of claim 17, wherein a conduction band minimum energy level ($E_C$) of the molecular interlayer is greater than or equal to an $E_C$ of the active layer and smaller than or equal to an $E_C$ of the electron transport layer.

21. The optoelectronic device of claim 17, wherein the inorganic semiconductor comprises at least one selected from Zn oxide, Ti oxide, Sn oxide, and Zr oxide.

22. The optoelectronic device of claim 17, wherein the organic semiconductor comprises at least one selected from TFB, CBP, TPD, PVK, TCTA, NPD, PFB, and F8T2.

23. The optoelectronic device of claim 17, wherein the electron transport layer comprises ZnO, and
the molecular interlayer comprises tetracyanoquinodimethane (TCNQ).

24. The optoelectronic device of claim 17, further comprising a hole injection layer disposed between the first electrode and the hole transport layer, the hole injection layer comprising an organic or inorganic semiconductor different than the organic semiconductor of the hole transport layer.

25. The optoelectronic device of claim 17, further comprising an electron injection layer disposed between the second electrode and the electron transport layer, the electron injection layer comprising an inorganic or organic material different than the inorganic semiconductor of the electron transport layer.

26. The optoelectronic device of claim 1, wherein a first energy conduction band of the molecular interlayer is in direct contact with a second energy conduction band of the active layer.

* * * * *